US006586993B2

(12) United States Patent
Macedo

(10) Patent No.: US 6,586,993 B2
(45) Date of Patent: Jul. 1, 2003

(54) IMPEDANCE MATCHING LOW NOISE AMPLIFIER HAVING A BYPASS SWITCH

(75) Inventor: José A. Macedo, Kanata (CA)

(73) Assignee: Research In Motion Limited, Waterloo (CA)

( * ) Notice: Subject to any disclaimer, the term of this patent is extended or adjusted under 35 U.S.C. 154(b) by 0 days.

(21) Appl. No.: 10/007,482

(22) Filed: Nov. 7, 2001

(65) Prior Publication Data

US 2002/0053947 A1 May 9, 2002

Related U.S. Application Data

(60) Provisional application No. 60/246,787, filed on Nov. 8, 2000.

(51) Int. Cl.$^7$ .................................................. H03F 1/14
(52) U.S. Cl. ..................... 330/51; 330/149; 330/151; 330/191; 330/251; 330/254; 330/302; 330/331
(58) Field of Search .................. 330/51, 251, 254, 330/151, 331, 191, 302, 293, 149

(56) References Cited

U.S. PATENT DOCUMENTS

| | | | | |
|---|---|---|---|---|
| 4,042,887 A | * | 8/1977 | Mead et al. | 330/53 |
| 5,661,434 A | * | 8/1997 | Brozovich et al. | 330/51 |
| 5,821,811 A | * | 10/1998 | Persson | 330/51 |
| 6,002,860 A | * | 12/1999 | Voinigescu et al. | 703/14 |
| 6,020,848 A | * | 2/2000 | Wallace et al. | 342/362 |
| 6,118,338 A | * | 9/2000 | Frank et al. | 330/51 |
| 6,141,561 A | * | 10/2000 | Izumiyama | 455/550 |
| 6,175,279 B1 | * | 1/2001 | Ciccarelli et al. | 330/296 |
| 6,253,070 B1 | * | 6/2001 | Andrews | 455/287 |

OTHER PUBLICATIONS

TUE4A–4, A 1.7mA Low Noise Amplifier with Integrated Bypass Switch for Wireless 0.05–6 GHz Portable Applications, Henrik Morkner, et al., 2001 IEEE Radio Frequency Integrated Circuits Symposium.

III–2, A High Performance Switched–LNA IC for CDMA Handset Receiver Applications, Ray Moroney, et al., 1998 IEEE Radio Frequency Integrated Circuits Symposium.

TUE1–2, A Minature PHEMT Switched–LNA for 800 MHz to 8.0 GHz Handset Applications, Henrik Morkner, et al., 1999 IEEE Radio Frequency Integrated Circuits Symposium.

TUE4A–1, A Wide Dynamic Range Switched–LNA In Sige BICMOS, Toshifumi Nakatani, et al., 2001 IEEE Radio Frequency Integrated Circuits Symposium.

* cited by examiner

*Primary Examiner*—Michael Tokar
*Assistant Examiner*—Linh V Nguyen
(74) *Attorney, Agent, or Firm*—Jones Day; Krishna K. Pathiyal; Charles B. Meyer

(57) ABSTRACT

An impedance matching low noise amplifier ("LNA") having a bypass switch includes an amplification circuit, a bypass switching network and a match adjustment circuit. The amplification circuit has an amplifier input and an amplifier output, and is configured to receive a radio frequency (RF) input signal at the amplifier input and apply a gain to generate an amplified RF output signal at the amplifier output. The bypass switching network is coupled to a low-gain control signal and is also coupled between the amplifier input and the amplifier output. The bypass switching network is configured to couple the amplifier input to the amplifier output when the low-gain control signal is enabled in order to feed the RF input signal through to the RF output signal. The match adjustment circuit is coupled to the low-gain control signal and the RF input signal, and is configured to couple the RF input signal to an impedance when the low-gain control signal is enabled.

41 Claims, 6 Drawing Sheets

IMPEDANCE MATCHING LOW NOISE AMPLIFIER HAVING A BYPASS SWITCH

CROSS-REFERENCE TO RELATED APPLICATION

This application claims priority from and is related to the following prior application: "System and Method for Low Noise Amplification Using A Switch," U.S. Provisional Application No. 60/246,787, filed Nov. 8, 2000. This prior application, including the entire written description and drawing figures, is hereby incorporated into the present application by reference.

BACKGROUND

1. Field of the Invention

This invention relates generally to the field of analog signal processing. More particularly, an impedance matching low noise amplifier having a bypass switch is provided that is especially well suited for use in a staged amplification system for a mobile communications device.

2. Description of the Related Art

The use of a low noise amplifier in a staged amplification system is known. One such amplification system is a cascading amplification system, commonly used in the receiver chain of mobile communication devices. A typical cascading amplification system utilizes at least two stages of amplification. Significantly, the first stage of amplification of the cascading amplifier critically affects the system noise figure because the noise output after the first stage is amplified by subsequent stages. For this reason, the first stage of a cascading amplification system typically consists of a low noise amplifier ("LNA"), which is characterized by a low noise figure.

SUMMARY

An impedance matching low noise amplifier ("LNA") having a bypassing switch includes an amplification circuit, a bypass switching network and a match adjustment circuit. The amplification circuit has an amplifier input and an amplifier output, and is configured to receive a radio frequency (RF) input signal at the amplifier input and apply a gain to generate an amplified RF output signal at the amplifier output. The bypass switching network is coupled to a low-gain control signal and is also coupled between the amplifier input and the amplifier output. The bypass switching network is configured to couple the amplifier input to the amplifier output when the low-gain control signal is enabled in order to feed the RF input signal through to the RF output signal. The match adjustment circuit is coupled to the low-gain control signal and the RF input signal, and is configured to couple the RF input signal to an impedance when the low-gain control signal is enabled.

DETAILED DESCRIPTION

Single-band LNA

Figure 1:
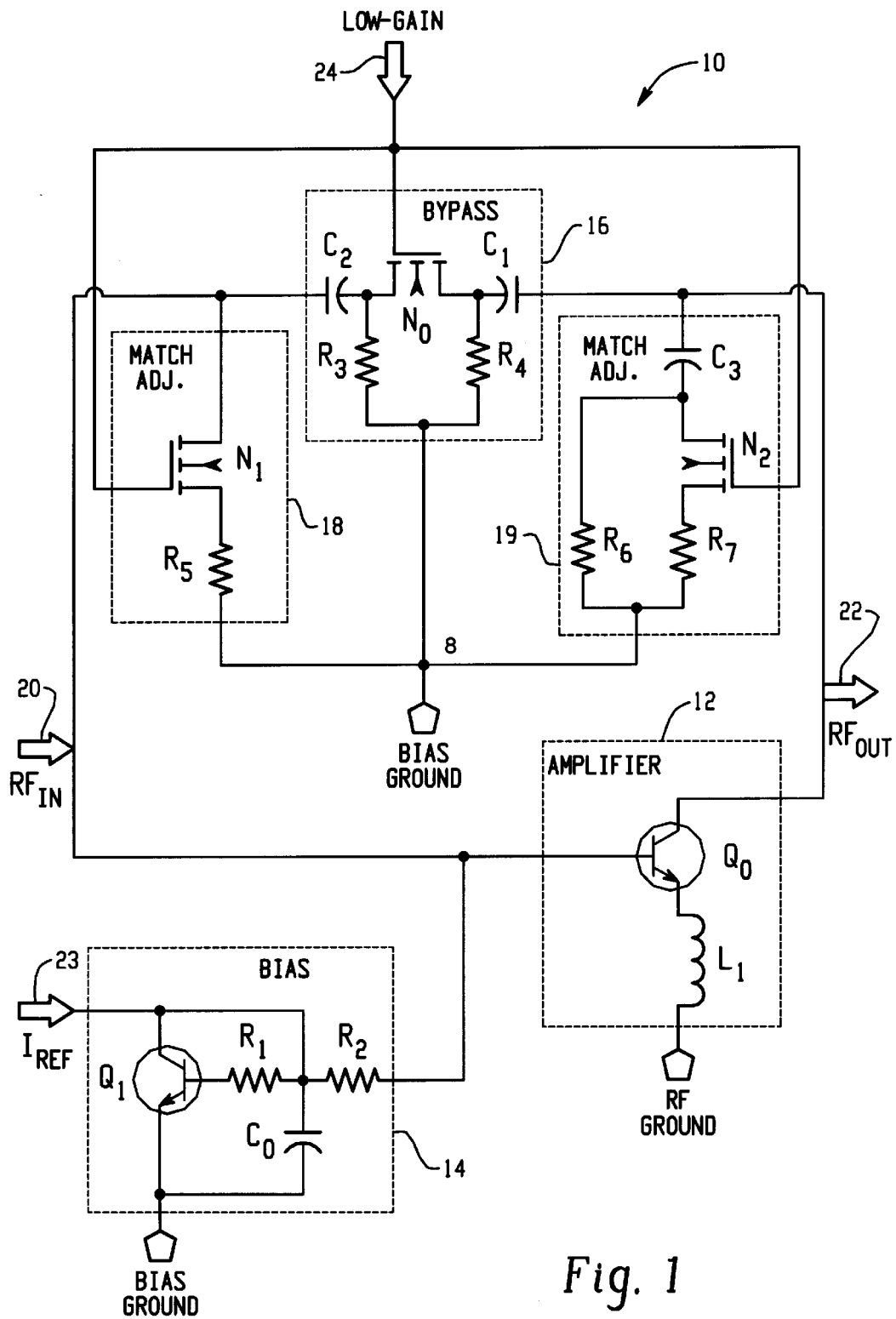
FIG. 1 is a circuit diagram of an exemplary low noise amplifier according to one embodiment of the claimed invention.

FIG. 1 is a circuit diagram of an exemplary low noise amplifier ("LNA") 10 according to one embodiment of the claimed invention. The LNA 10 includes a bipolar amplification circuit 12, a DC biasing network 14, a bypass switching network 16, and match adjustment circuits 18, 19. In a preferred embodiment, all of the circuit elements shown in FIG. 1 are located on a single integrated circuit (IC). In addition, the LNA 10 may also include off-chip circuit elements for input and output impedance matching, which are described below with reference to FIG. 2.

Operationally, the LNA 10 functions in two modes, a high-gain mode and a low-gain mode. While in high-gain mode, an RF input signal 20 is amplified by the bipolar amplification circuit 12 and DC biasing network 14 to generate an RF output signal 22. When switched into low-gain mode, the DC biasing network 14 is disabled, and the RF input signal 20 is fed forward to the RF output 22 through the bypass switching network 16. In this manner, power is conserved when a high-power RF input signal 20 is received that does not require amplification. In addition, the match adjustment circuits 18, 19 are enabled in low-gain mode in order to compensate for input and output impedance differences between the bipolar amplification circuit 12 and the bypass switching network 16.

The bipolar amplification circuit 12 is preferably a single-stage amplifier that includes a bipolar transistor Q0 and a degeneration inductor L1. The bipolar transistor Q0 is preferably sized to achieve high gain and a minimum noise figure. The degeneration inductor L1 is preferably coupled between ground and the emitter of Q0 in order to improve the linearity of the amplifier 12. The base of the bipolar transistor Q0 is coupled to the RF input signal 20 and is also coupled to the DC biasing network 14 to form a current mirror. The DC biasing network 14 preferably includes a bipolar transistor Q1 that is coupled to the bipolar amplification circuit 12 through an RC circuit R1, R2, C0, and is also coupled to a DC reference current (Iref) 23. The DC reference current (Iref) 23 is preferably generated in a band gap reference circuit configured to provide a stable DC current that is substantially independent of temperature and supply voltage. The resistive values in the RC circuit R1, R2 control the amount of current gain in the current mirror, and thus determine the current of the bipolar transistor Q0. The current through the bipolar transistor Q0 defines its transit frequency, which together with L1 and the external matching circuits define the gain applied to the RF input signal 20 when the LNA 10 is in high-gain mode. It should be understood, however, that the biasing network 14 may be implemented using many known biasing circuits configured to form a current mirror with Q0, and is not limited to the implementation illustrated in FIG. 1. It should also be understood that alternative embodiments may include a multi-stage transistor amplifier, such as a cascode amplifier configuration. The use of a single-stage transistor amplifier, however, provides a low noise figure and also conserves power consumption by enabling low voltage operation.

The bypass switching network 16 includes an NMOS switch N0 coupled between the RF input 20 and the RF output 22, and is controlled by a low-gain control signal 24. The bypass switching network 16 also preferably includes two resistors R3, R4 respectively coupled between ground and the drain and source terminals of the NMOS switch N0, and two capacitors C1, C2 that block any DC components of the RF input and output signals 20, 22. These resistive and capacitive elements R3, R4, C1, C2 maintain a low DC voltage at the source and drain of the NMOS switch N0, thus improving the turn-on speed of the NMOS switch N0 and reducing the impedance between the source and drain of N0 when the switch N0 is on.

The match adjustment circuit 18 preferably includes an input impedance matching shunt resistor R5 coupled between ground and the RF input 20 through an NMOS switch N1. The NMOS switch N1 is controlled by the low-gain control signal 24, and couples the impedance matching resistor R5 to the RF input 20 when the LNA 10 is in low-gain mode. The value of the impedance matching resistor R5 is selected to maintain a substantially constant input reflection coefficient as the LNA 10 is switched from high-gain to low-gain mode by compensating for the impedance differences between the bipolar transistor Q0 and the NMOS switch N0. Preferably, the impedance-matching resistor combines with off-chip impedance matching components, discussed below with reference to FIG. 2, to match the input impedance to a fifty ohm (50Ω) source at the frequency band of interest. In addition, the impedance matching resistor R5 preferably compensates for parasitic impedance from the disabled bipolar transistor Q0 when the LNA 10 is in low-gain mode. In this manner, the off-chip impedance matching components may be selected to provide the desired input impedance (preferably 50Ω) when the LNA 10 is in high-gain mode, taking into consideration the impedance of the active bipolar transistor Q0. Then, when the LNA 10 is switched to low-gain mode, the impedance matching resistor R5 is coupled to the RF input 20 to maintain a constant input reflection coefficient. By compensating for the inherent impedance differences between bipolar and NMOS devices and the parasitic impedance of the bipolar transistor Q0, the input impedance adjustment circuit 18 enables the use of a bipolar amplifier Q0 in the same LNA 10 as an NMOS bypass switch N0, thus combining the superior amplification properties of a bipolar transistor with the superior switching properties of an NMOS transistor.

Depending upon the operational frequency of the LNA 10, an additional match adjustment circuit 19 may also be included at the output of the bypass switching network 16 to compensate for output impedance differences when the LNA 10 is in low-gain mode. The output impedance adjustment circuit 19 preferably includes an NMOS switch N2, two resistors R6, R7, and a capacitor C3. The NMOS switch N2 is controlled by the low-gain control signal 24, and couples the output impedance matching shunt resistor R7 in parallel with the resistor R6 when the LNA 10 is in low-gain mode. Similar to the input impedance adjustment circuit 18, the value of the impedance matching resistor R7 is chosen to compensate for the impedance differences between the NMOS switch N0 and the bipolar transistor Q0 and parasitic impedance from the disabled bipolar transistor Q0 in low-gain mode. The impedance matching resistor R7 preferably combines with off-chip impedance matching components, discussed below with reference to FIG. 2, to match the output impedance to a fifty ohm (50Ω) load at the frequency band of interest. The resistor R6 and capacitor C3 are preferably included to improve the turn-on performance and reduce the impedance of the NMOS switch N2 by lowering the drain voltage of the transistor N2. Capacitor C3 serves to block any DC components. Resistor R6 maintains the drain at 0V DC to ensure good switching of N2. Preferably, the value of impedance matching resistor R7 is small in comparison to the resistor R6 such that the value of R6 does not significantly affect the output impedance of the LNA 10.

Operationally, when the LNA 10 is in high-gain mode, the low-gain control signal is disabled, the NMOS switches N0, N1 and N2 are open, and the DC reference current (Iref) 23 is on, activating the DC biasing network 14. The DC reference current (Iref) 23 is amplified and mirrored in the bipolar transistor Q0, thus amplifying the RF input signal 20 at the base of Q0 to generate the RF output signal 22. When in high-gain mode, the bypass switching network 16 has little, if any, effect on the performance of the LNA 10. Then, when the low-gain control signal 24 is enabled to enter low-gain mode, the NMOS switches N0, N1 and N2 are closed, thus activating the bypass switching network 16 and match adjustment circuits 18, 19. In low-gain mode, the RF input signal 20 is fed forward through the bypass switching network 16 to the RF output 22, and the resistors R5, R7 are coupled to the circuit 10 to compensate for input and output impedance differences between the amplification circuit 12 and the bypass switching network 16. In addition, the DC biasing current (Iref) is preferably switched off in low-gain mode to conserve power.

Figure 2:
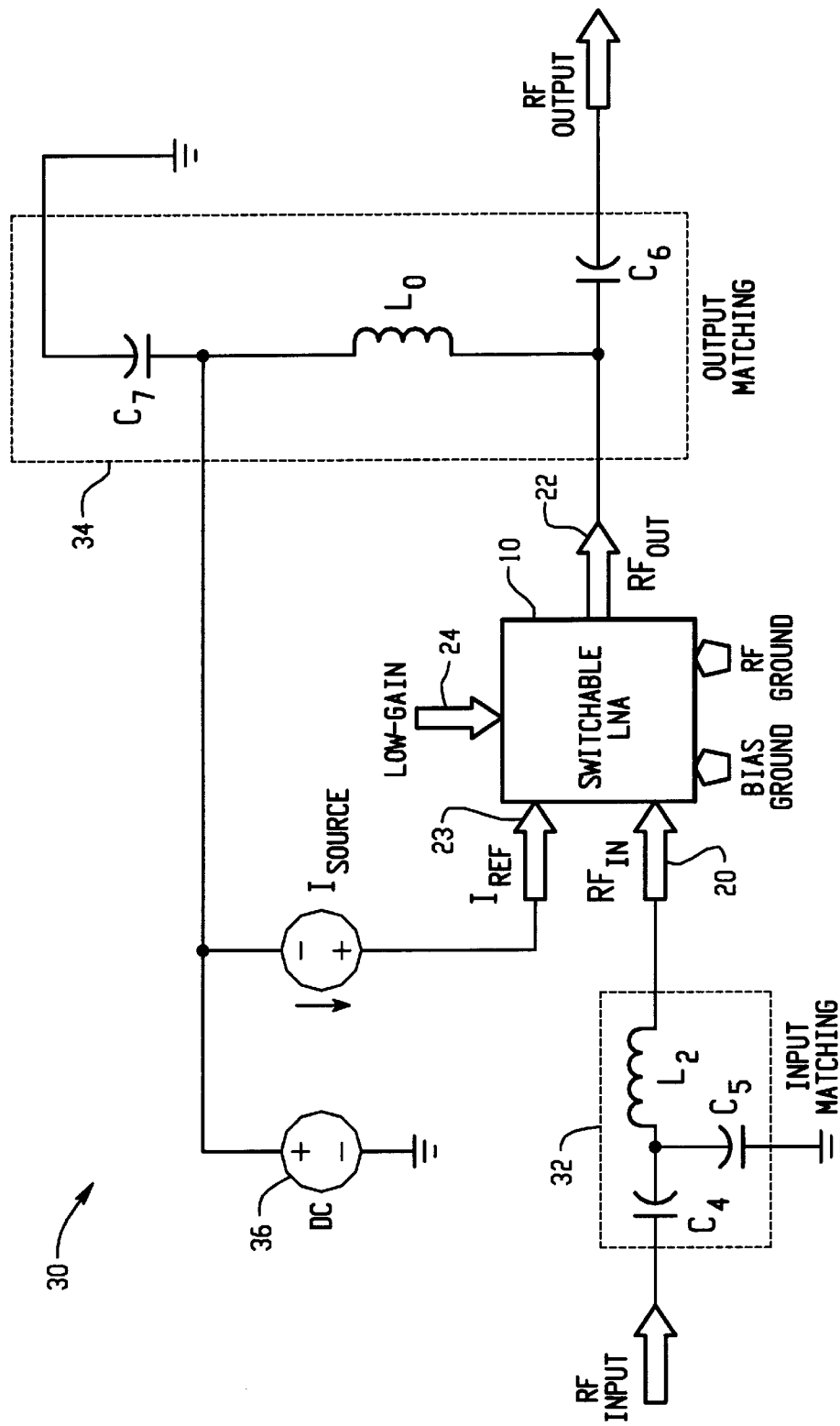
FIG. 2 is a circuit diagram of exemplary off-chip impedance matching circuits for use with the LNA shown in FIG. 1.

FIG. 2 is a circuit diagram 30 of exemplary off-chip impedance matching circuits 32, 34 for the LNA 10 shown in FIG. 1. The circuit 30 includes the LNA 10, an input impedance matching circuit 32 and an output impedance matching circuit 34. The input impedance matching circuit 32 preferably includes a series inductor L2 and a shunt capacitor C5 coupled with the RF input 20. In addition, a capacitor C4 is preferably coupled in series with L2, and acts as a DC block. The output impedance matching circuit 34 preferably includes an inductor L0 coupled between the RF output signal 22 and a supply voltage 36, a capacitor C7 coupled between the inductor L0 and ground, and a capacitor C6 coupled in series with the RF output 22. It should be understood, however, that other known impedance matching configurations may be utilized for the input and output impedance matching circuits 32, 34.

The values of the components in the input and output impedance matching circuits 32, 34 are preferably chosen according to the operational frequency of the LNA 10 in order to achieve input and output matching, preferably to a fifty ohm (50Ω) source and load. In addition, the component values of the off-chip impedance matching circuits 32, 34 may be varied in order to adapt the LNA 10 shown in FIG. 1 to alternative near frequency bands. For example, the values of the off-chip impedance matching components L0, L2 and L6 shown in FIG. 2 may be varied to switch the operational frequency band of the LNA 10 between the PCS band (1.96 GHz) and the DCS band (1.84 GHz).

Figure 3:
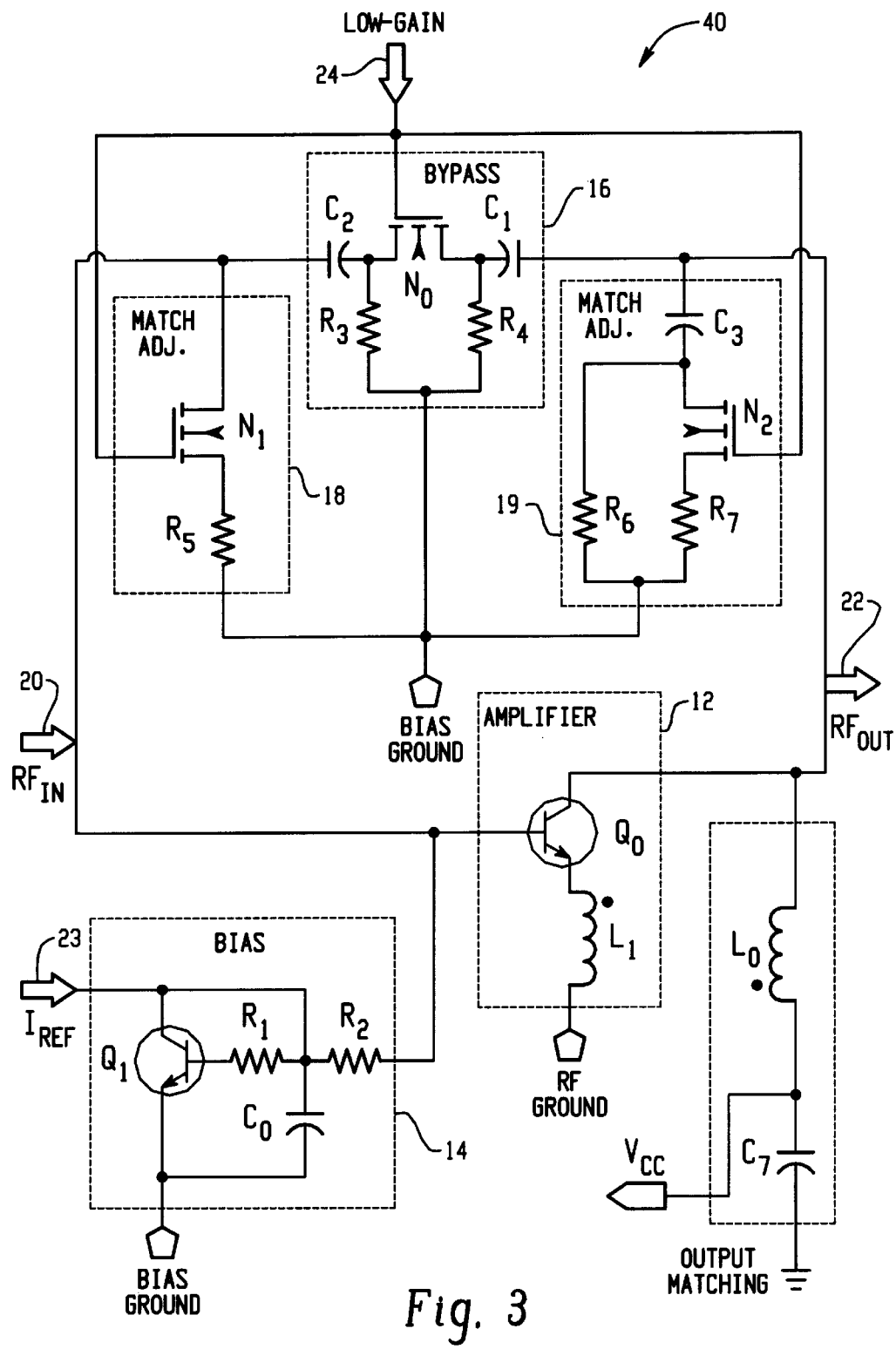
FIG. 3 is a circuit diagram of an exemplary LNA having an on-chip output matching inductor.
Figure 4:
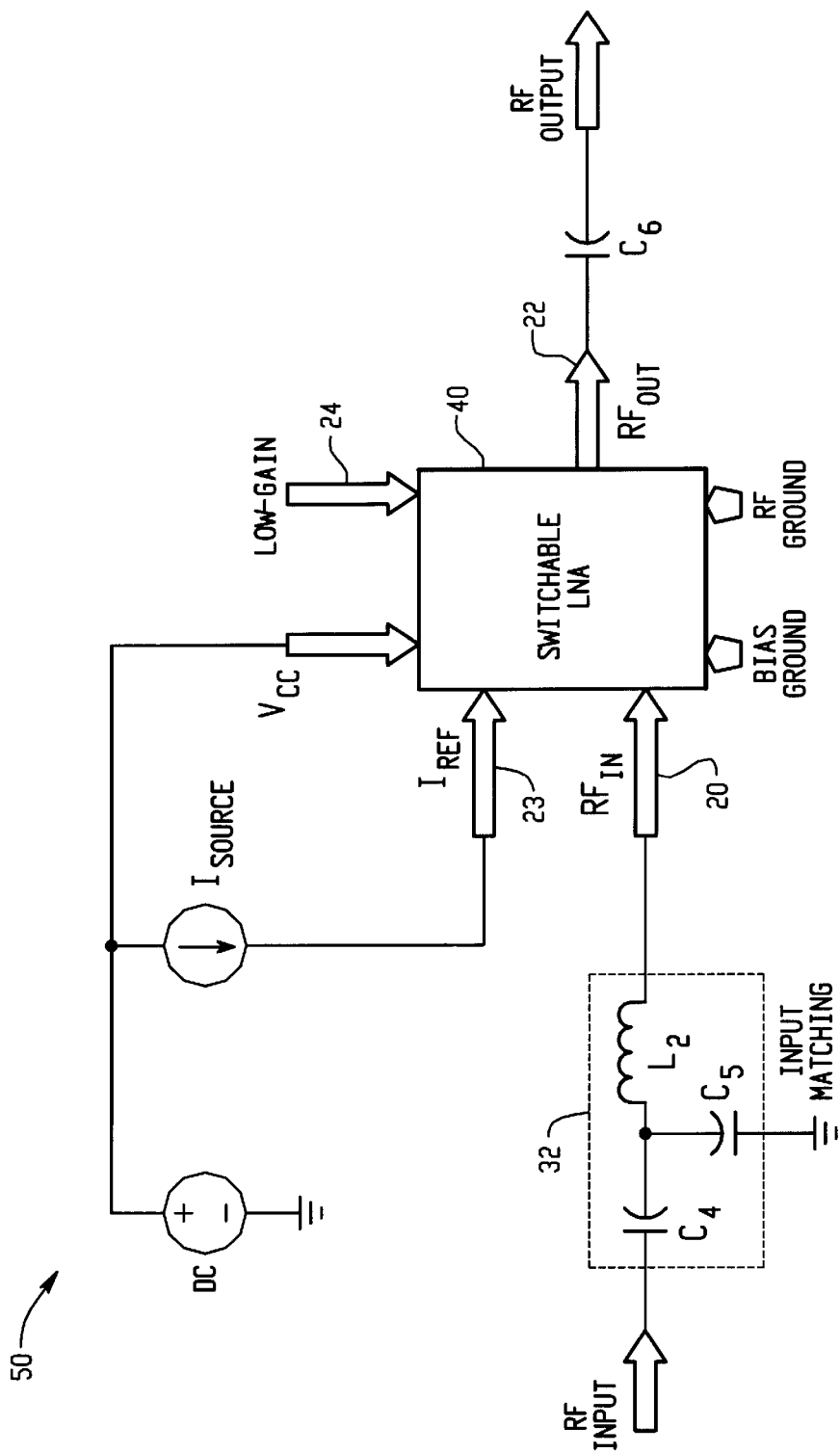
FIG. 4 is a circuit diagram of exemplary off-chip impedance matching components for use with the LNA shown in FIG. 3.

FIG. 3 is a circuit diagram of an exemplary LNA 40 having an on-chip output impedance matching inductor L0. FIG. 4 is a circuit diagram 50 of exemplary off-chip impedance matching components for the LNA 40 shown in FIG. 3. The LNA 40 shown in FIGS. 3 and 4 is similar to the LNA 10 described above with reference to FIGS. 1 and 2, except that the inductor L0 and capacitor C7 are included on the LNA integrated circuit. Placing these output impedance matching components L0, C7 on-chip results in a significantly more compact design that is particularly useful for applications, such as mobile communication devices, in which circuit size is a constraint. Fabricating the shunt inductor L0 on the same silicon substrate and in close proximity to the degeneration inductor L1, however, may cause electromagnetic coupling between the two on-chip inductors L0, L1. Electromagnetic coupling through the silicon substrate and surroundings induces currents in the inductors L0, L1 thereby causing feedback. Because the output impedance matching inductor L0 is large with respect to the degeneration inductor L1, this feedback can cause excess current to build in the degeneration inductor L1, thereby destabilizing the amplifier 12. The two inductors L0, L1 thus act as a transformer in which the magnetic field generated by current flowing through the larger inductor L0 induces a current in the smaller inductor L1 and vice versa. To prevent destabilization, the inductors L0, L1 are preferably fabricated such that a negative feedback is induced, i.e., the induced current in the degeneration inductor L1 is in the opposite direction of its operative current flow. The polarities of the inductors L0,L1 are preferably selected to ensure negative feedback.

Figure 5:
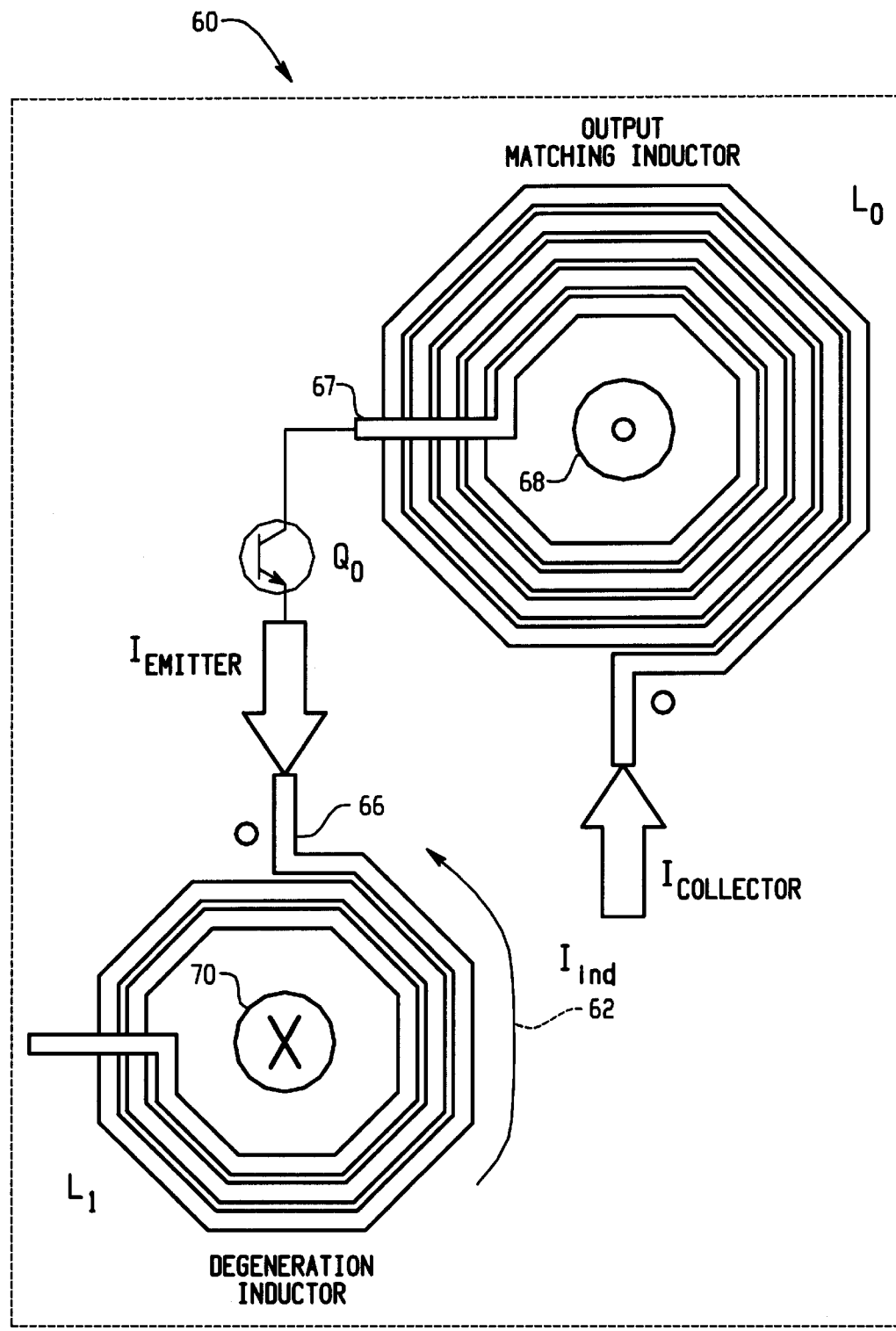
FIG. 5 is a schematic diagram showing an exemplary layout for the fabrication of an impedance-matching shunt inductor and degeneration inductor on a silicon substrate.

FIG. 5 is a schematic diagram 60 showing an exemplary fabrication layout of an impedance matching shunt inductor L0 and degeneration inductor L1 on a silicon substrate. The inductors L0, L1 may be fabricated on a silicon substrate using any known integrated circuit fabrication technique, and are preferably fabricated in an octagonal spiral pattern as shown, but may, alternatively, be fabricated in other patterns, such as a square or circular spiral pattern. In order to generate negative feedback between the inductors L0, L1, the spiral patterns should wind in opposite directions. For example, L0 is shown with a counter-clockwise winding starting from the outside turn and L1 is shown with a clockwise winding. In this manner, the magnetic field of the impedance matching inductor L0 will induce a negative current flow (Iind) 62 in the degeneration inductor L1.

The inner termination point 67 of the impedance matching inductor L0 is preferably coupled to the collector of the bipolar transistor Q0 shown in FIG. 3 and FIG. 5, and the outer termination point 66 of the degeneration inductor L1 is preferably coupled to the emitter of Q0. Therefore, operational current flows into the inductors L0, L1 in the direction shown by the arrows in FIG. 5. The resultant magnetic field generated by the impedance matching inductor L0 is illustrated by the circles 68, 70 at the center of the inductors L0, L1. Using the right-hand rule, one skilled in the art will recognize that the magnetic field generated by L0 flows out of the plane of the paper at the circle 68 and reenters the plane of the paper at the circle 70. This magnetic field from L0 thus induces a counter-clockwise current flow (Iind) 62, or negative feedback, in the degeneration inductor L1. Because the induced current (Iind) is small in comparison to the operational current (Iemitter) in the degeneration inductor L1, the negative feedback does not significantly effect the operation of the LNA 40. If current were induced in the opposite direction, however, then the amplifier 12 could become unstable.

Multi-band LNA

Preferably, the single-band LNAs described above with reference to FIGS. 1–5 are designed to function within a single RF frequency band. In order to create a multi-band receiver, two or more LNAs are preferably combined into one device, such as a dual-band or triple-band receiver. Each LNA in the multi-band receiver is preferably configured to meet the requirements of the frequency band of interest. For instance, in a mobile communication device, a multi-band receiver may include two or more LNAs configured to meet the frequency requirements of various cellular communication standards, such as GSM, EGSM, PCS and DCS.

Figure 6:
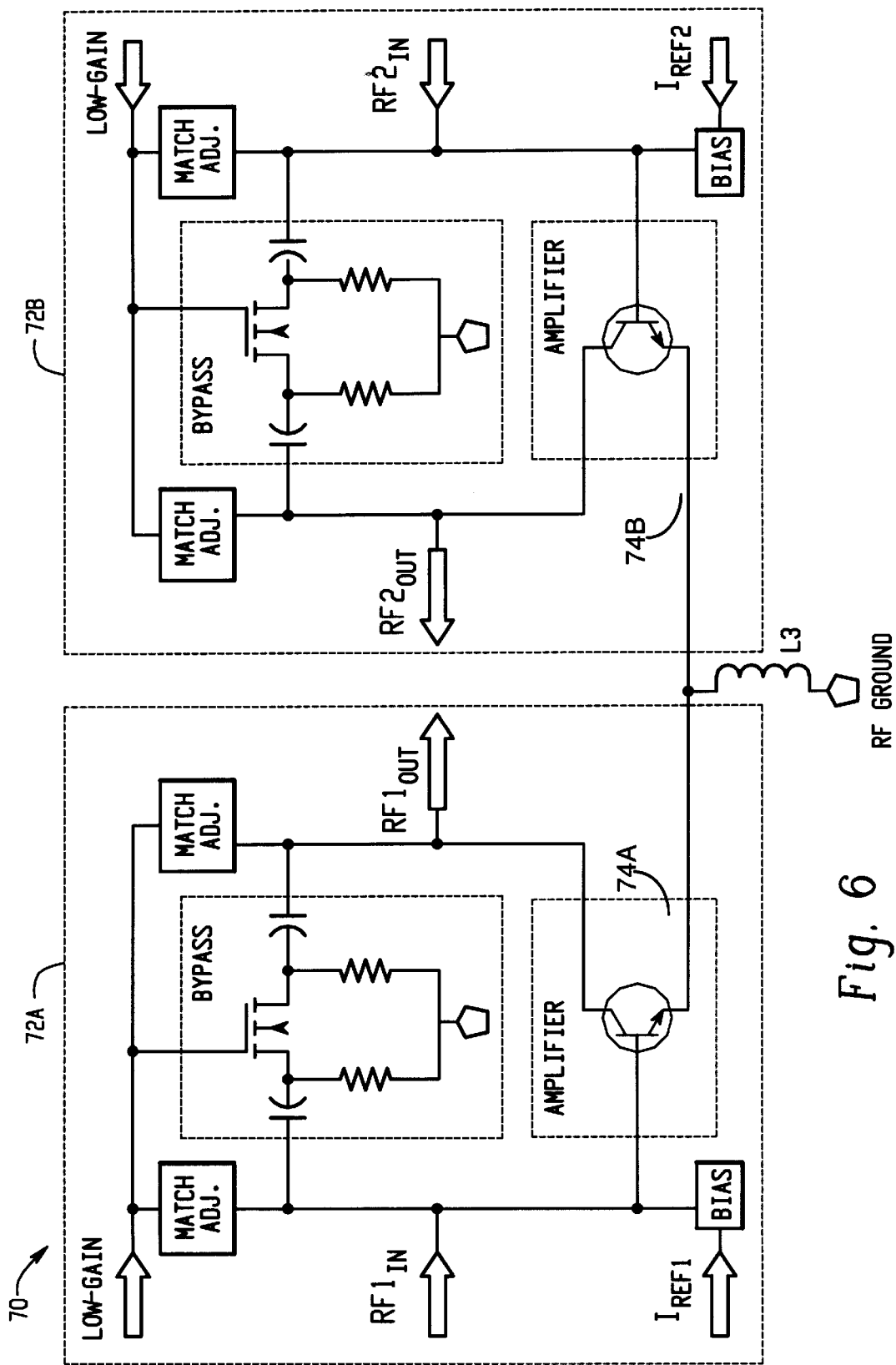
FIG. 6 is a circuit diagram of an exemplary dual-stage LNA utilizing a shared degeneration inductor.

FIG. 6 is a circuit diagram of an exemplary dual-band LNA 70 utilizing a shared degeneration inductor L3. The dual-band LNA 70 includes two single-band LNAs 72A, 72B and the shared degeneration inductor L3. The single-band LNAs 72A, 72B are each similar to the exemplary LNA 10 described above with reference to FIG. 1, except the amplification circuits 74A, 74B are both coupled to the single shared degeneration inductor L3. All of the circuit components shown in FIG. 6 are preferably included in a single integrated circuit ("IC"). In addition, off-chip impedance matching circuits, as illustrated in FIG. 2, may be coupled to the input and output of each of the singe-band LNAs 72A, 72B.

The two single-band LNAs 72A, 72B are preferably configured to operate at near frequency bands. For instance, one LNA 72A may be configured for the PCS band (1.96 GHz) and the other LNA 72B for the DCS band (1.84 GHz). In this manner, a single inductance value L3 may be chosen that is suitable for both circuits 72A, 72B. When one LNA 72A or 72B is operational, the other LNA 72A or 72B is deactivated, and thus does not significantly effect the operation of the shared degeneration inductor L3. This function is possible because a receiver chain including the dual-band LNA 70 will operate at only one frequency band at a given instant, and, therefore, should never require the simultaneous use of both of the single-band LNAs 72A, 72B. Thus, when one of the single-band LNAs 72A, 72B is in use, the other LNA is preferably powered down by setting its DC reference current (Iref) to zero. In alternative embodiments, additional components may be included to further isolate the inactive LNA 72A or 72B from the circuit 70. For instance, the base voltage of the bipolar transistors Q0, Q1 in the amplification circuit and DC biasing network of the inactive LNA 72A or 72B could be biased or otherwise clamped to a fixed voltage while the LNA is powered down. Moreover, by reverse biasing the inactive transistor, parasitic effects, such as parasitic capacitance, are further reduced.

The shared degeneration inductor L3 significantly reduces the amount of IC surface area required to fabricate a dual-band LNA 70. For example, the degeneration inductor L1 in the single-band LNA 10 shown in FIG. 1 may account for fifty percent of the space required to fabricate the circuit 10 on an IC. By utilizing a shared degeneration inductor L3, a dual-band LNA 70 can be fabricated that occupies only fifty percent more space than a single-band LNA.

This written description uses examples to disclose the invention, including the best mode, and also to enable any person skilled in the art to make and use the invention. The patentable scope of the invention is defined by the claims, and may include other examples that occur to those skilled in the art.

I claim:

1. A low noise amplifier (LNA), comprising:
    an amplification circuit having an amplifier input and an amplifier output, and configured to receive a radio frequency (RF) input signal at the amplifier input and apply a gain to generate an amplified RF output signal at the amplifier output;
    a bypass switching network coupled to a low-gain control signal and also coupled between the amplifier input and the amplifier output, and configured to coupled the amplifier input to the amplifier output when the low-gain control signal is enabled in order to feed the RF input signal through to the RF output signal;
    a match adjustment circuit coupled to the low-gain control signal and the RF input signal, and configured to coupled the RF input signal to an impedance when the low-gain control signal is enabled; and
    an additional match adjustment circuit coupled to the low-gain control signal and the RF output signal, and configured to coupled the RF output signal to an additional impedance when the low-gain control signal is enabled;

wherein the additional match adjustment circuit comprises:

an n-channel metal-oxide semiconductor (NMOS) transistor having a gate terminal, a first current-carrying terminal and a second current-carrying terminal, wherein the gate terminal is coupled to the low-gain control signal;

a capacitor having a first terminal and a second terminal, wherein the first terminal of the capacitor is coupled to the first current-carrying terminal of the NMOS transistor and the second terminal of the capacitor is coupled to the RF output signal; and an impedance matching resistor coupled between the second current carrying terminal and ground.

2. The low noise amplifier of claim 1, wherein the additional match adjustment circuit further comprises:

a resistor coupled between the first current-carrying terminal of the NMOS transistor and ground.

3. The low noise amplifier of claim 1, wherein the amplification circuit comprises a bipolar transistor.

4. The low noise amplifier of claim 1, wherein the amplification circuit comprises:

a bipolar transistor having a base terminal, an emitter terminal and a collector terminal, wherein the base terminal is coupled to the RF input signal and the collector terminal is coupled to the RF output signal; and a degeneration inductor coupled between the emitter terminal of the bipolar transistor and ground.

5. The low noise amplifier of claim 1, wherein the bypass switching network comprises a field-effect transistor (FET).

6. The low noise amplifier of claim 1, wherein the bypass switching network comprises:

an n-channel metal-oxide semiconductor (NMOS) transistor having a gate terminal, a first current-carrying terminal and a second current-carrying terminal, wherein the gate terminal is coupled to the low-gain control signal;

a first capacitor coupled between the first current-carrying terminal of the NMOS transistor and the amplifier input;

a second capacitor coupled between the second current-carrying terminal of the NMOS transistor and the amplifier output;

a first resistor coupled between the first current-carrying terminal of the NMOS transistor and ground; and a second resistor coupled between the second current-carrying terminal of the NMOS transistor and ground.

7. The low noise amplifier of claim 1, wherein the match adjustment circuit comprises:

an n-channel metal-oxide semiconductor (NMOS) transistor having a gate terminal, a first current-carrying terminal and a second current-carrying terminal, wherein the gate terminal is coupled to the low-gain control signal and the first current-carrying terminal is coupled to the RF input signal; and an impedance matching resistor coupled between the second current carrying terminal and ground.

8. The low noise amplifier of claim 1, further comprising an input-matching impedance coupled in series with the RF input signal.

9. The low noise amplifier of claim 8, wherein the input-matching impedance comprises:

a first capacitor coupled in series with the RF input signal;

an inductor coupled in series with the RF input signal; and a shunt capacitor coupled between the inductor and ground.

10. The low noise amplifier of claim 1, further comprising an output-matching impedance coupled to the RF output signal.

11. The low noise amplifier of claim 10, wherein the amplification circuit, bypass switching network, match adjustment circuit and output-matching impedance are fabricated on a single integrated circuit substrate.

12. The low noise amplifier of claim 10, wherein the output-matching impedance comprises:

an inductor coupled between the RF output signal and a source voltage;

a first capacitor coupled between the source voltage and ground; and a second capacitor coupled in series with the RF output signal.

13. A low noise amplifier (LNA), comprising:

an amplification circuit having an amplifier input and an amplifier output, and configured to receive a radio frequency (RF) input signal at the amplifier input and apply a gain to generate an amplified RF output signal at the amplifier output;

a bypass switching network coupled to a low-gain control signal and also coupled between the amplifier input and the amplifier output, and configured to coupled the amplifier input to the amplifier output when the low-gain control signal is enabled in order to feed the RF input signal through to the RF output signal;

a match adjustment circuit coupled to the low-gain control signal and the RF input signal, and configured to coupled the RF input signal to an impedance when the low-gain control signal is enabled; and a DC biasing network coupled to the amplification circuit that controls the gain applied to the RF input signal by the amplification circuit that controls the gain applied to the RF input signal by the amplification circuit, wherein the DC biasing network forms a current mirror with the amplification circuit, and wherein the current in the DC biasing network is switched off when the low-gain control signal is enabled.

14. The low noise amplifier of claim 13, wherein the DC biasing network comprises:

a bipolar transistor having a base terminal, a collector terminal and an emitter terminal, wherein the collector terminal is coupled to a DC reference current and the emitter terminal is coupled to ground; and an RC circuit coupled between the base terminal of the bipolar transistor and the amplifier input;

wherein the RC circuit controls the gain of the amplification circuit, and wherein the reference current is switched off when the low-gain control signal is enabled.

15. The low noise amplifier of claim 13, wherein the amplification circuit comprises a bipolar transistor.

16. The low noise amplifier of claim 13, wherein the amplification circuit comprises:

a bipolar transistor having a base terminal, an emitter terminal and a collector terminal, wherein the base terminal is coupled to the RF input signal and the collector terminal is coupled to the RF output signal; and a degeneration inductor coupled between the emitter terminal of the bipolar transistor and ground.

17. The low noise amplifier of claim 13, wherein the bypass switching network comprises a field-effect transistor (FET).

18. The low noise amplifier of claim 13, wherein the bypass switching network comprises:
   an n-channel metal-oxide semiconductor (NMOS) transistor having a gate terminal, a first current-carrying terminal and a second current-carrying terminal, wherein the gate terminal is coupled to the low-gain control signal;
   a first capacitor coupled between the first current-carrying terminal of the NMOS transistor and the amplifier input;
   a second capacitor coupled between the second current-carrying terminal of the NMOS transistor and the amplifier output;
   a first resistor coupled between the first current-carrying terminal of the NMOS transistor and ground; and
   a second resistor coupled between the second current-carrying terminal of the NMOS transistor and ground.

19. The low noise amplifier of claim 13, wherein the match adjustment circuit comprises:
   an n-channel metal-oxide semiconductor (NMOS) transistor having a gate terminal, a first current-carrying terminal and a second current-carrying terminal, wherein the gate terminal is coupled to the low-gain control signal and the first current-carrying terminal is coupled to the RF input signal; and
   an impedance matching resistor coupled between the second current carrying terminal and ground.

20. The low noise amplifier of claim 13, further comprising an input-matching impedance coupled in series with the RF input signal.

21. The low noise amplifier of claim 20, wherein the input-matching impedance comprises:
   a first capacitor coupled in series with the RF input signal;
   an inductor coupled in series with the RF input signal; and
   a shunt capacitor coupled between the inductor and ground.

22. The low noise amplifier of claim 13, further comprising an output-matching impedance coupled to the RF output signal.

23. The low noise amplifier of claim 22, wherein the amplification circuit, bypass switching network, match adjustment circuit and output-matching impedance are fabricated on a single integrated circuit substrate.

24. The low noise amplifier of claim 22, wherein the output-matching impedance comprises:
   an inductor coupled between the RF output signal and a source voltage;
   a first capacitor coupled between the source voltage and ground; and
   a second capacitor coupled in series with the RF output signal.

25. A low noise amplifier (LNA) integrated circuit, comprising:
   an amplifying transistor having an input terminal coupled to a radio frequency (RF) input signal and configured to amplify the RF input signal and generate a radio frequency (RF) output signal at an output terminal;
   a degeneration inductor coupled between a third terminal of the amplifying transistor and ground;
   a bypass switching network coupled to a low-gain control signal and also coupled between the input and output terminals of the amplifying transistor, and configured to couple the input terminal to the output terminal when the low-gain control signal is enabled in order to feed the RF input signal through to the RF output signal;
   a match adjustment circuit coupled to the low-gain control signal and the RF input signal, and configured to coupled the RF input signal to an impedance when the low-gain control signal is enabled; and
   an output impedance matching inductor coupled between the RF output signal and a supply voltage;
   wherein the degeneration inductor and the output impedance matching inductor are fabricated on a silicon substrate in a spiral pattern, and wherein the spiral pattern for the degeneration inductor winds in an opposite direction as the spiral pattern for the output impedance matching inductor.

26. The low noise amplifier integrated circuit of claim 25, wherein the spiral pattern of the degeneration inductor and the output impedance matching inductor is a octagonal spiral pattern.

27. The low noise amplifier integrated circuit of claim 25, wherein the spiral pattern of the degeneration inductor and the output impedance matching inductor is a square spiral pattern.

28. The low noise amplifier (LNA) integrated circuit of claim 25, further comprising:
   an output impedance matching capacitor coupled between the output impedance matching inductor and ground.

29. The low noise amplifier integrated circuit of claim 25, wherein the output impedance matching inductor induces a negative feedback in the degeneration inductor.

30. The low noise amplifier integrated circuit of claim 25, wherein the amplifying transistor is an NPN bipolar transistor, and wherein the input terminal of the amplifying transistor is the base terminal of the NPN bipolar transistor, the output terminal of the amplifying transistor is the collector terminal of the NPN bipolar transistor, and the third terminal of the amplifying transistor is the emitter terminal of the NPN bipolar transistor.

31. The low noise amplifier integrated circuit of claim 25, wherein the amplifying transistor is a field-effect transistor (FET).

32. The low noise amplifier integrated circuit of claim 25, further comprising: an additional match adjustment circuit coupled to the low-gain control signal and the RF output signal, and configured to couple the RF output signal to an additional impedance when the low-gain control signal is enabled.

33. A low noise amplifier (LNA) integrated circuit, comprising:
   an amplifying transistor having an input terminal coupled to a radio frequency (RF) input signal and configured to amplify the RF input signal and generate a radio frequency (RF) output signal at an output terminal;
   a degeneration inductor coupled between a third terminal of the amplifying transistor and ground;
   a bypass switching network coupled to a low-gain control signal and also coupled between the input and output terminals of the amplifying transistor, and configured to couple the input terminal to the output terminal when the low-gain control signal is enabled in order to feed the RF input signal through to the RF output signal;
   a match adjustment circuit coupled to the low-gain control signal and the RF input signal, and configured to coupled the RF input signal to an impedance when the low-gain control signal is enabled;

an output impedance matching inductor coupled between the RF output signal and a supply voltage;

a DC biasing network coupled to the input terminal of the amplifying transistor that controls the gain applied to the RF input signal by the amplifying transistor, wherein the DC biasing network forms a current mirror with the amplifying transistor, and wherein the current in the DC biasing network is switched off when the low-gain control signal is enabled.

34. The low noise amplifier (LNA) integrated circuit of claim 33, further comprising:

an output impedance matching capacitor coupled between the output impedance matching inductor and ground.

35. The low noise amplifier integrated circuit of claim 33, wherein the output impedance matching inductor induces a negative feedback in the degeneration inductor.

36. The low noise amplifier integrated circuit of claim 33, wherein the amplifying transistor is an NPN bipolar transistor, and wherein the input terminal of the amplifying transistor is the base terminal of the NPN bipolar transistor, the output terminal of the amplifying transistor is the collector terminal of the NPN bipolar transistor, and the third terminal of the amplifying transistor is the emitter terminal of the NPN bipolar transistor.

37. The low noise amplifier integrated circuit of claim 33, wherein the amplifying transistor is a field-effect transistor (FET).

38. The low noise amplifier integrated circuit of claim 33, further comprising: an additional match adjustment circuit coupled to the low-gain control signal and the RF output signal, and configured to couple the RF output signal to an additional impedance when the low-gain control signal is enabled.

39. A dual-band low noise amplifier (LNS), comprising:

a first low noise amplifier having a first amplification circuit and configured to operate in a first frequency band;

a second low noise amplifier having a second amplification circuit and configured to operate in a second frequency band; and a shared degeneration inductor coupled to the first and second amplification circuits;

wherein the first low noise amplifier is disabled when the second low noise amplifier is operational and the second low noise amplifier is disabled when the first low noise amplifier is operational;

wherein the first and second amplification circuit both include an amplifier input and an amplifier output and are configured to receive a radio frequency (RF) input signal at the amplifier input and apply a gain to generate an amplified RF output signal at the amplifier output, and wherein the first and second low noise amplifiers both include:

a bypass switching network coupled to a low-gain control signal and also coupled between the amplifier input and the amplifier output, and configured to coupled the amplifier input to the amplifier output when the low-gain control signal is enabled in order to feed the RF input signal through to the RF output signal;

a match adjustment circuit coupled to the low-gain control signal and the RF input signal, and configured to couple the RF input signal to an impedance when the low-gain control signal is enabled;

a DC biasing network coupled to the amplification circuit that controls the gain applied to the RF input signal by the amplification circuit, wherein the DC biasing network forms a current mirror with the amplification circuit, and wherein the current in the DC biasing network is switched off when the low-gain control signal is enabled, and wherein the current in the DC biasing network is also switched off to disable one of the first or second low noise amplifier when another of the first or second amplifier is operational.

40. The dual-band low noise amplifier of claim 39, wherein the first and second low noise amplifiers further include an additional match adjustment circuit coupled to the low-gain control signal and the RF output signal, and configured to couple the RF output signal to an additional impedance when the low-gain control signal is enabled.

41. The dual-band low noise amplifier of claim 37, wherein the first and second amplification circuits include an NPN bipolar transistor.

* * * * *

UNITED STATES PATENT AND TRADEMARK OFFICE
CERTIFICATE OF CORRECTION

PATENT NO.      : 6,586,993 B2
DATED           : July 1, 2003
INVENTOR(S)     : Jose A. Macedo It is certified that error appears in the above-identified patent and that said Letters Patent is hereby corrected as shown below:

<u>Column 12,</u>
Line 39, please replace "of claim 37" with -- of claim 39 --

Signed and Sealed this

Seventh Day of October, 2003

JAMES E. ROGAN
*Director of the United States Patent and Trademark Office*